(12) United States Patent
Mukai

(10) Patent No.: US 6,311,384 B1
(45) Date of Patent: *Nov. 6, 2001

(54) METHOD OF MANUFACTURING OXIDE SUPERCONDUCTING WIRE

(76) Inventor: Hidehito Mukai, c/o Osaka Works of Sumitomo Electric Industries, Ltd., 1-3, Shimaya 1-chome, Konohana-ku, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/955,323

(22) Filed: Oct. 20, 1997

Related U.S. Application Data

(63) Continuation of application No. 08/611,235, filed on Mar. 5, 1996, now abandoned, which is a continuation of application No. 08/275,079, filed on Jul. 12, 1994, now abandoned, which is a continuation of application No. 07/895,173, filed on Jun. 5, 1992, now abandoned, which is a continuation of application No. 07/633,871, filed on Dec. 26, 1990, now abandoned.

(30) Foreign Application Priority Data

Dec. 28, 1989 (JP) ........................................ 1-341391

(51) Int. Cl.$^7$ ............................................. H01L 39/24
(52) U.S. Cl. ............................. 29/599; 505/1; 505/739; 505/740
(58) Field of Search ................................ 29/599; 505/1, 505/739, 740

(56) References Cited

U.S. PATENT DOCUMENTS 5,100,867 * 3/1992 Gunzelmann et al. .............. 29/599

FOREIGN PATENT DOCUMENTS

| 38 04 601 A1 | 8/1989 | (DE) . |
|---|---|---|
| 0 285 319 A2 | 10/1988 | (EP) . |
| 2 615 651 A1 | 11/1988 | (FR) . |
| 60199521 A | 10/1985 | (JP) . |
| 01007419 A | 1/1989 | (JP) . |
| 01258832 A | 10/1989 | (JP) . |
| 2-207420 * | 8/1990 | (JP) . |
| 03192613 A | 8/1991 | (JP) . |
| 4-292814 * | 10/1992 | (JP) . |
| 4-334819 * | 11/1992 | (JP) . |
| WO 89/06053 | 6/1989 | (WO) . |

OTHER PUBLICATIONS

Samanata et al., "A novel processing technique for fabrication of flexible $YDa_2Cu_3O_{7-x}$ wire," J. Appl. Phys. 66(9), Nov. 1, 1989, pp. 4532–4534.

* cited by examiner

*Primary Examiner*—Carl J. Arbes

(57) ABSTRACT

An oxide superconducting wire is obtained by performing plastic working and heat treatment of a metal pipe which is filled up with raw material powder of an oxide superconductor. In the plastic working step, the metal pipe is subjected to flat working so that the raw material powder flows in the longitudinal direction as well as the cross direction in the metal pipe. In this case, a draft of at least 80% and not more than 98% is selected in the flat working step, to further promote the cross-directional flow of the raw material powder, thereby further improving density of the raw material powder. Thus, the as-formed oxide superconducting wire exhibits higher critical current density.

6 Claims, 1 Drawing Sheet

METHOD OF MANUFACTURING OXIDE SUPERCONDUCTING WIRE

This is a continuation, of application Ser. No. 08/611,235, filed Mar. 5, 1996, now abandoned, which is a continuation application of application Ser. No. 08/275,079, filed on Jul. 12, 1994, now abandoned, which is a continuation application of application Ser. No. 07/895,173, filed on Jun. 5, 1992, now abandoned, which is a continuation application of application Ser. No. 07/633,871, filed on Dec. 26, 1990, now abandoned.

BACKGROUND OF THE INVENTION

1. Field of the Invention

The present invention relates to a method of manufacturing an oxide superconducting wire by plastically working an oxide superconductor into a wire, and more particularly, it relates to an improvement in a plastic working step.

2. Description of the Background Art

In general, an oxide superconducting wire is manufactured by filling up a metal pipe with oxide raw material powder, working the same into a wire through a step of plastic working such as extrusion, wire drawing, rolling or the like, and thereafter heat treating the wire. It is known that such plastic working and heat treatment are effectively repeated in order to improve critical current density of the as-formed wire.

In relation to such a method of manufacturing an oxide superconducting wire, densification of the oxide superconductor filling up the metal pipe contributes to improvement of critical current density. In order to densify the oxide superconductor, therefore, it has been necessary to perform flat working on the basis of press working, roll working or the like. The flat working is adapted to compress a round wire, for example, along its sectional direction, thereby working the same into a wire having a flat section. Such flat working is generally carried out in a plurality of stages in order to reasonably attain a desired sectional configuration or desired dimensions. Thus, flat working based on press working is inferior in high-volume production capability since it is necessary to perform flat working in sequence on every portion of a wire, while that based on roll working is inferior in workability since a plurality of working steps are carried out.

SUMMARY OF THE INVENTION

Accordingly, an object of the present invention is to provide a method of manufacturing an oxide superconducting wire, which can efficiently obtain a superconducting wire having high critical current density.

The inventor has made deep study and experiments as to relations between working conditions and critical current density values of oxide superconducting wires obtained by flat working capable of continuously manufacturing long members, and found that an oxide superconducting wire having high critical current density can be obtained by performing flat working at a draft of at least 80% and not more than 98%, even if such a flat working step is carried out only once.

According to the present invention, a method of manufacturing an oxide superconducting wire at least comprises a step of plastically working an oxide superconductor for working the same into a wire, and in order to solve the aforementioned technical problem, the plastic working step includes a step of performing flat working at a draft of at least 80% and not more than 98%.

Thus, according to the present invention, the plastic working step includes a step of performing flat working at a draft of at-least 80% and not more than 98% in order to improve density of the oxide superconductor, whereby it is possible to efficiently obtain an oxide superconducting wire, which exhibits high and homogeneous critical current density along its longitudinal direction after heat treatment.

Thus, the oxide superconducting wire obtained according to the inventive method is effectively applicable to the field of a cable or a magnet, which is prepared from a long wire, in particular.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
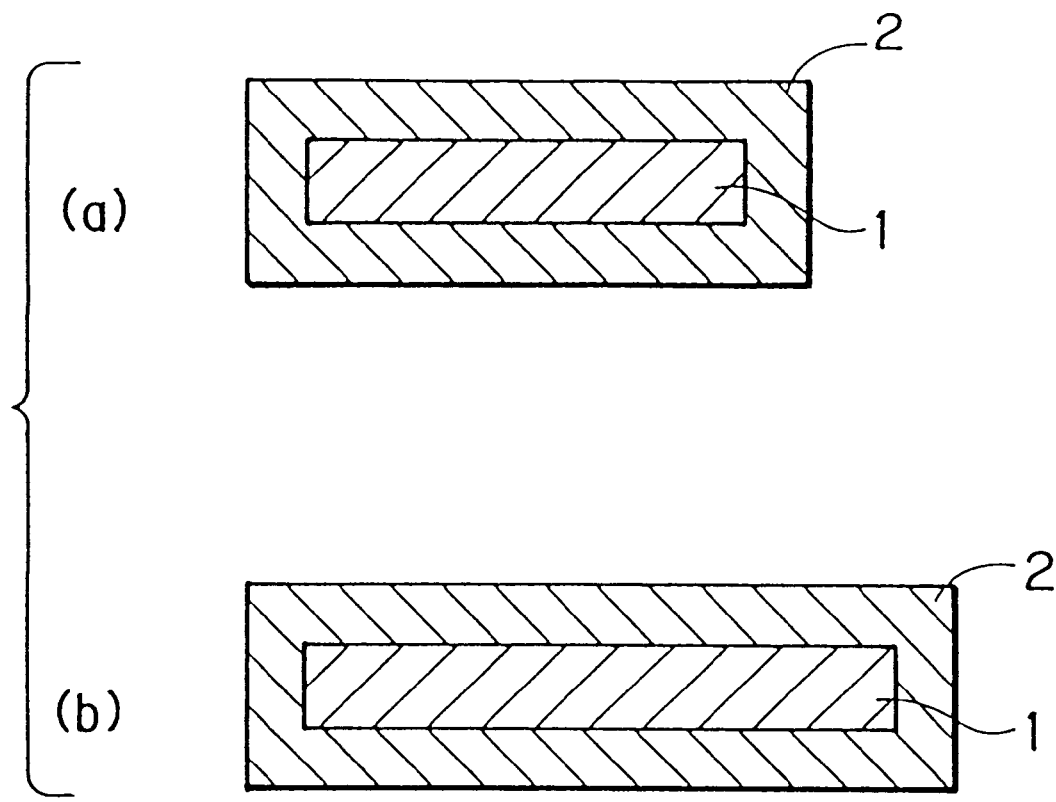
FIG. 1 shows sections of oxide superconducting wires, for illustrating function of the present invention.

For example, powder which fills up a metal pipe flows in longitudinal and cross directions upon roll working. When flat roll working is carried out in a single step in order to attain a desired draft, the cross-directional flow of the powder, which fills up the metal pipe, is further promoted as compared with that caused through a plurality of steps. This is now described with reference to FIG. 1.

FIG. 1 illustrates sections of (a) an oxide superconducting wire prepared from a round wire by flat roll working through a plurality of steps, and (b) an oxide superconducting wire of the same thickness prepared from a similar round wire by single-step flat roll working. Comparing the wires (a) and (b) shown in FIG. 1, it is understood that superconductive powder 1 cross-directionally flows at a larger rate in the wire (b), which is formed by single-step flat roll working, as compared with the wire (a), which is formed through a plurality of steps. Referring to FIG. 1, numeral 2 denotes metal sheaths.

The superconductive powder 1 is constrained by upper and lower rolls or the like when the same flows in the cross direction, whereby density of the superconductive powder 1 is further increased as compared with that attained through a longitudinal flow. In this case, therefore, it is possible to manufacture an oxide superconducting wire having higher critical current density.

EXPERIMENTAL EXAMPLE 1

$Bi_2O_3$, PbO, $SrCO_3$, $CaCO_3$ and CuO were mixed to prepare powder containing Bi, Pb, Sr, Ca and Cu in composition ratios of 1.8:0.4:2:2.2:3.

This powder was heat treated at 800° C. for eight hours, and then the heat treated substance was pulverized into powder in an automatic mortar for two hours. Thereafter the pulverized substance was heat treated at 860° C. for eight hours, and again pulverized into powder similarly to the above.

The as-formed powder was introduced into a silver pipe of 12 mm in outer diameter and 8 mm in inner diameter, and drawn into a diameter of 1.0 mm. This substance was subjected to single-step flat roll working with a two-high rolling mill of 150 mm in diameter at drafts of 75% (reference example No. 1), 80% (Example No. 1), 90% (Example No. 2) and 95% (Example No. 3) respectively, to prepare wires of 50 cm in length. Then, these wires were heat treated, again rolled at the same draft of 25%, and thereafter subjected to final heat treatment.

Current terminals were mounted across the wires of 50 cm in length obtained in the aforementioned manner, while voltage terminals were mounted at regular intervals of 5 cm, to measure values of critical current density $J_c$ of the respective blocks. Table 1 shows average values of critical current density $J_c$ and percentages of dispersion (standard deviation) in relation to these wires.

The configuration of such a wire was inhomogeneously deformed when the wire was worked at a draft exceeding 98%.

In order to prepare further reference examples, the aforementioned drawn wires of 1 mm in diameter were rolled at the same draft of 40% by flat roll working in a plurality of steps, so that total thickness reduction rates were 80% (reference example No. 2), 90% (reference example No. 3) and 95% (reference example No. 4) respectively. In the final steps, these samples were rolled at a draft of less than 40%, for the purpose of thickness control. Then the samples were subjected to heat treatment, rolling and heat treatment similarly to the above. Table 1 also shows values of critical current density $J_c$ of the as-formed wires.

TABLE 1

|  | No. | Draft (%) | Total Thickness Reduction Rate (%) | Thickness (mm) | Average Jc Value ($\times 10^4$ A/cm$^2$) | Dispersion (%) |
|---|---|---|---|---|---|---|
| Example | 1 | 80 | 80 | 0.20 | 2.20 | 6 |
|  | 2 | 90 | 90 | 0.10 | 2.50 | 3 |
|  | 3 | 95 | 95 | 0.05 | 2.30 | 5 |
| Reference Example | 1 | 75 | 75 | 0.25 | 1.60 | 10 |
|  | 2 | 40 | 80 | 0.20 | 0.80 | 14 |
|  | 3 | 40 | 90 | 0.10 | 0.95 | 10 |
|  | 4 | 40 | 95 | 0.05 | 0.85 | 13 |

The critical current density values $J_c$ were measured at the same temperature of 77.3 K with no application of external magnetic fields, and calculated from current values generating voltages of 1 $\mu$V across the voltage terminals which were mounted at the intervals of 5 cm.

As clearly understood from Table 1, improvement of critical current density, which is conceivably caused by improvement in denseness and orientation property, is remarkably attained by performing single-step flat roll working at a draft of at least 80% and not more than 95% (Examples Nos. 1 to 3), more preferably around 90%, in comparison with any of the reference examples. As compared with the samples (reference examples Nos. 2 to 4) which were worked to attain similar total thickness reduction rates to Examples by flat roll working in a plurality of steps at the draft of 40%, in particular, it is understood that Examples are advantageous as methods of manufacturing superconducting wires in workability, in addition to improvement of critical current density.

EXPERIMENTAL EXAMPLE 2

A density ratio of the superconductor according to Example No. 2 (draft: 90%) was measured among the samples prepared in Experimental Example 1. The density ratio is defined as (density of superconductor)/(theoretical density of superconductor).

For the purpose of comparison, a density ratio was similarly measured as to the superconductor according to reference example No. 3, which was prepared by performing flat roll working in a plurality of steps at the draft of 40% so that the total thickness reduction rate was 90%, among reference examples prepared in Experimental Example 1.

Table 2 shows the density ratios of these superconductors, with drafts, total thickness reduction rates, thicknesses and widths.

TABLE 2

|  | Example | Reference Example |
|---|---|---|
| Draft (%) | 90 | 40 |
| Total Thickness Reduction Rate (%) | 90 | 90 |
| Thickness (mm) | 0.10 | 0.10 |
| Width (mm) | 4.0 | 2.5 |
| Density Ratio of Superconductor (%) | 90 | 80 |

In the aforementioned Experimental Example 1, the wires obtained by flat roll working at the drafts of 80 to 95% (total thickness reduction rates of 80 to 95%) were superior in average critical current density and dispersion to those obtained by flat roll working at the draft of 40% to attain the total thickness reduction rates of 80 to 95%. As understood from Table 2, this is because the widths of the former wires were larger than those of the latter wires and superconductive materials flowed at larger rates in cross directions while being vertically constrained by rolls, and hence the density ratios of the superconductors were increased.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of plastically working an Bi oxide superconductor into an Bi oxide superconducting wire, said method comprising steps in the following order:

drawing said Bi oxide superconductor;

performing a single-step flat rolling work on said Bi oxide superconductor at a draft of at least about 80% and not more than about 98%;

then heat treating said Bi oxide superconductor;

performing a second rolling work on said Bi oxide superconductor; and heat treating again on said Bi oxide superconductor, wherein said Bi oxide superconductor exhibits homogeneous critical current density and has an average critical current density of at least 2.2×10$^4$ A/cm$^2$.

2. A method in accordance with claim 1, wherein said flat working step is carried out at a draft of around 90%.

3. A method in accordance with claim 1, wherein said flat working step is carried out only once in said plastic working step.

4. A method in accordance with claim 1, wherein said plastic working step is carried out on a metal pipe filled with said oxide superconductor.

5. A method in accordance with claim 1, wherein said Bi oxide superconductor has a density ratio of at least 90.

6. A method in accordance with claim 1, wherein said second rolling work on said Bi oxide superconductor is performed at the draft of 25%.

* * * * *